United States Patent [19]
Duboz

[11] Patent Number: 5,818,066
[45] Date of Patent: Oct. 6, 1998

[54] OPTOELECTRONIC QUANTUM WELL DEVICE HAVING AN OPTICAL RESONANT CAVITY AND SUSTAINING INTER SUBBAND TRANSITIONS

[75] Inventor: Jean-Yves Duboz, Cachan, France

[73] Assignee: Thomson-CSF, Paris, France

[21] Appl. No.: 746,810

[22] Filed: Nov. 18, 1996

[30] Foreign Application Priority Data

Nov. 21, 1995 [FR] France .................................. 95 13785

[51] Int. Cl.⁶ ............................. H01L 29/06; H01L 33/00
[52] U.S. Cl. .............................. 257/21; 257/96; 257/98; 257/184; 257/432
[58] Field of Search .................................. 257/14, 21, 98, 257/432, 96, 184; 359/247, 248; 372/45, 46, 50

[56] References Cited

FOREIGN PATENT DOCUMENTS 0 549 132  6/1993  European Pat. Off. .
41 35 813  5/1992  Germany .

OTHER PUBLICATIONS

"Normal Incidence Intersubband Absorption In Vertical Quantum Wells," V. Berger et al. Applied Physics Letter; vol. 66, No. 2, Jan. 9, 1995, pp. 218–220.

"Grating Enhancement Of Quantum Well Detector Response," K. W. Goossen et al. Applied Physics Letters; vol. 53, No. 12, Sep. 19, 1988. pp. 1027–1029.

"Near–Unity Quantum Efficiency of AlGaAs/GaAs Quantum Well Infrared Detectors Using A Waveguide With A Doubly Periodic Grating Coupler," J. Y. Andersson et al. Applied Physics Letters; vol. 59, No. 7, Aug. 12, 1991. pp. 857–859.

"Resonant Wavelength Selective Photodetectors," T. Wipiejewski et al. Proceedings Of The European Solid State Device Research Conference (ESSDERC), Leuven, Conference No. 22; Sep. 14–17, 1992.

"Observation Of Grating–Induced Intersubband Emission From GaAs/AlGaAs Superlattices," M. Helm et al. Applied Physics Letters; vol. 53, No. 18, Oct. 31, 1988. pp. 1714–1716.

"Infrared Intraband Laser Induced In A Multiple–Quantum–Well Interband Laser," A. Kastalsky. IEEE Journal Of Quantum Electronics; vol. 29, No. 4, Apr. 1, 1993.

*Primary Examiner*—Minh-Loan Tran
*Attorney, Agent, or Firm*—Oblon, Spivak, McClelland, Maier & Neustadt, P.C.

[57] ABSTRACT

An optoelectronic quantum well device comprises a stack of layers that have different gap widths and constitute quantum wells possessing, in the conduction band, at least two permitted energy levels, this stack of layers being included between two reflection means. The device also comprises a diffraction grating between one of the mirrors and the stack of layers.

7 Claims, 8 Drawing Sheets

FIG.1a

PRIOR ART

FIG.1b

PRIOR ART

OPTOELECTRONIC QUANTUM WELL DEVICE HAVING AN OPTICAL RESONANT CAVITY AND SUSTAINING INTER SUBBAND TRANSITIONS

BACKGROUND

The invention relates to an electronic quantum well device and especially to a laser device or electromagnetic wave detector.

Figure 1A:
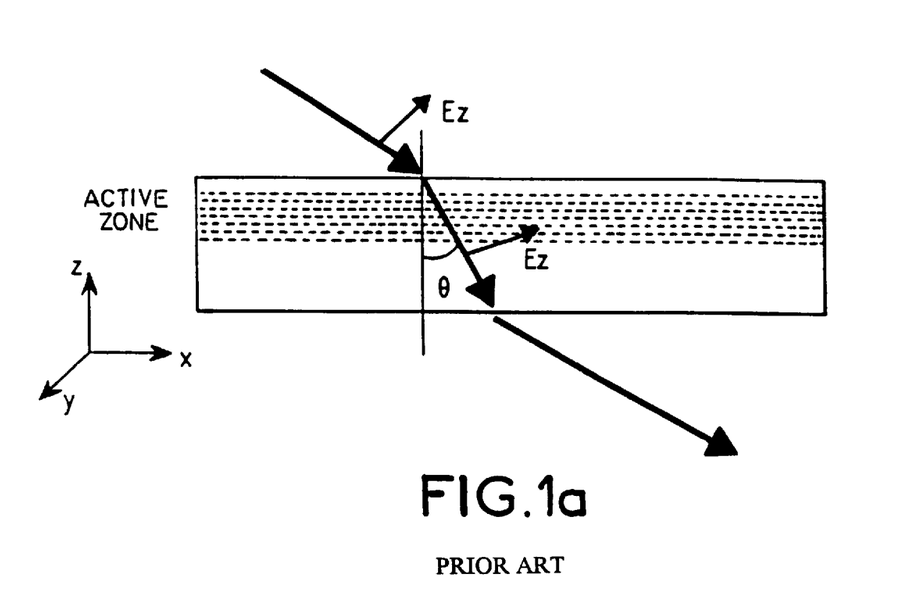
FIGS. 1a and 1b show devices known in the prior art.

Inter-subband transitions are used for infrared detection, modulation and emission. In most epitaxial systems and especially in the GaAs/AlGaAs system, the rules of selection on the polarization of light prohibit the interaction (absorption or emission) of light with wells at normal incidence. The inter-subband transitions are sensitive only to the field along z if z is the direction of growth perpendicular to the plane of the layer. More specifically, the interaction is proportional to $\sin^2\theta$, where $\theta$ is the angle of propagation of light measured with respect to the direction z (FIG. 1a).

Figure 1B:
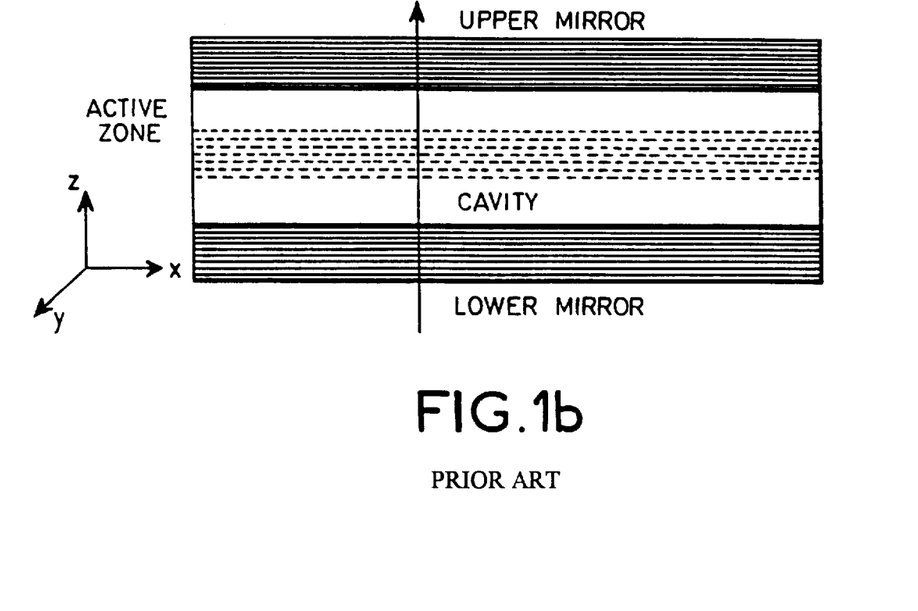

Furthermore, there are known vertical cavity surface emitting lasers (VCSELs) that give excellent performance. The cavity is then a plane microcavity made by deposits of thin layers on either side of the active zone and perpendicular to the axis z of growth (FIG. 1b). The lasers then emit in the direction z. In this case, the microcavity has the effect of reinforcing the field in the plane of the layers (plane xy) which may get coupled with the active zone of the laser (there are no rules of selection on the polarization of the field for the interband transitions). The same idea cannot be applied directly to the inter-subband transitions because of the rule of selection on the polarization of the field as indicated here above.

SUMMARY OF THE INVENTION

The invention relates to a structure that makes it possible, in a system with inter-subband transitions, to work at normal incidence to the plane of the layers and use the optical cavity effect.

The invention therefore relates to an optoelectronic quantum well device comprising a stack of layers that have different gap widths and constitute quantum wells possessing, in the conduction band, at least two permitted energy levels, this stack of layers being included between two reflection means, wherein said device comprises a diffraction grating between one of the mirrors and the stack of layers.

According to one variant of the invention, it relates to an optoelectronic quantum well device comprising a stack of layers that have different gap widths and constitute quantum wells possessing at least two permitted levels in the conduction band, this stack of layers being included between two reflection means, wherein one of the reflection means has a plane shape while the other means has relief features constituting a diffraction grating.

BRIEF DESCRIPTION OF THE DRAWINGS

The different objects and features of the invention shall appear more clearly in the following description and in the appended figures, of which:

FIG. 5 shows a characteristic curve of operation in detector mode of the device of FIG. 2a;

MORE DETAILED DESCRIPTION

Figure 2A:
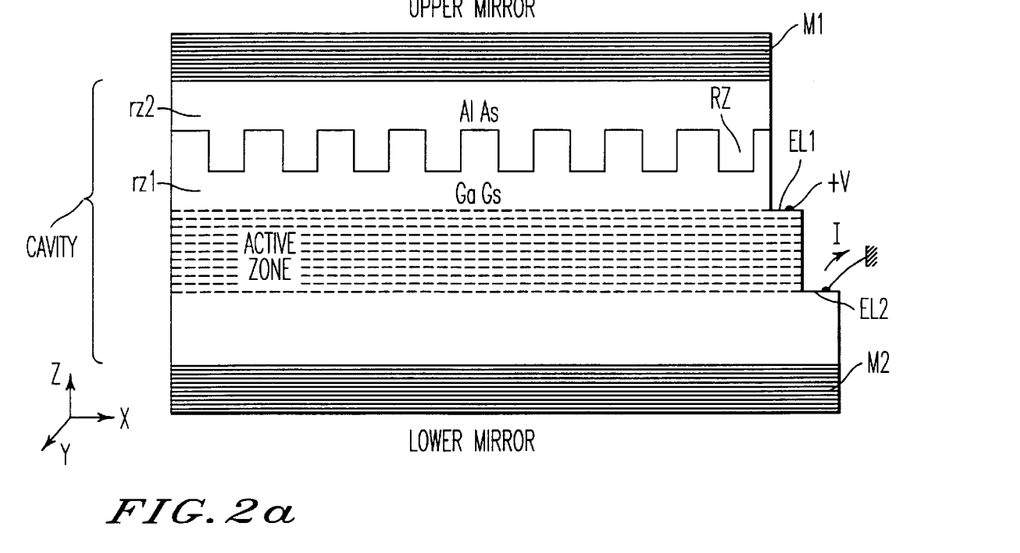
FIGS. 2a and 2b show exemplary embodiments of a device according to the invention.

Referring to FIG. 2a, a description shall now be given of an exemplary embodiment according to the invention. The structure of FIG. 2a has a stack of layers PQ of semiconductor materials with different gap widths and thicknesses such that they constitute a stack of quantum wells. This stack is included between two mirrors M1 and M2 forming an optical cavity. These mirrors M1 and M2 are preferably Bragg mirrors.

Between the mirror M1 and the stack PQ there is provided a diffraction grating RZ. This grating consists of a layer rz1 placed against the stack of layers PQ and having a surface with unequal relief features (crenellated features for example). A second layer rz2, made of a material with a refraction index different from that of the layer rz1 (for example a smaller refraction index) covers the relief features of the layer rz1. The layer rz2 bears the mirror M1.

The device has electrodes EL1 and EL2 electrically connected to the two faces of the stack PQ. These electrodes are used to polarize the structure and supply it with current. These electrodes also enable the connection of a current detector to enable an operation of the device in optical detector mode.

Figure 2B:
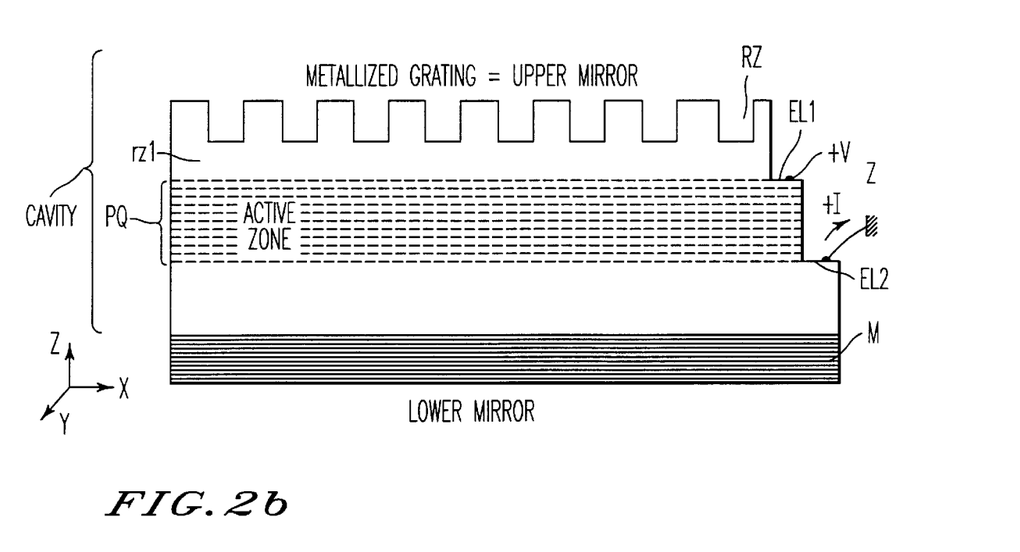

FIG. 2b shows an alternative embodiment according to which there is no provision made for the upper mirror M1 of FIG. 2a. However, the upper surface with relief features of the layer rz1 is made reflective, by a metallization for example, so as to constitute both the diffraction grating and the upper mirror of the optical cavity. The invention can be applied to the inter-subband transitions or to any other system verifying the same rules of selection: the transition is sensitive only to the field Ez perpendicular to the layers while the direction of emission or reception is the direction z. The cavity may be a microcavity that is similar or not similar to the one made in the VCSEL lasers. The microcavity generally offers advantages in terms of integration and performance characteristics. The gratings may be one-dimensional (only one polarization is coupled) or two-dimensional (both polarizations are coupled) and may be variable (lamellary, triangular or streaked) without the principle of operation being changed.

An illustration is given here below of the improvements in performance provided by the introduction of a microcavity for devices using inter-subband transitions in GaAs/AlGaAs wells and working at zero incidence. These examples are not restrictive and do not constitute absolute levels of optimization but give a realistic picture of performance characteristics accessible in these structures. For the inter-subband transitions, the idea may be applied to detection, modulation or emission.

A) In detection or emission, there are two cases to be distinguished:

A1) A wide spectral range is covered (this is the case of usual thermal imagers). The spectrum of incident radiation is wide (for example 8–12 $\mu$m), the spectral response of the detector is wide too (for example 8–10 $\mu$m) and the signal measured is proportional to the total absorbed power integrated throughout the spectrum. The microcavity has the effect of reducing the spectral width at the same time as it increases the peak response, while keeping the integral more or less constant.

A2) This case relates to the response on a narrow spectrum. In particular, it is sought to obtain a high response at a precise wavelength, for example the line 10.6 $\mu$m of the $CO_2$ laser. The structure then has a twofold advantage: it increases the response at the desired wavelength and at the same time it reduces the response at the neighboring wavelengths which induce noise in the measurement.

Two illustrations shall be given for the detection. Since the processes of absorption and emission are similar, the conclusions for emission (operation in laser mode) will be the same as for detection at a given wavelength. In particular, this idea can be applied perfectly to inter-subband lasers.

1) This example covers detectors coupled by a metallized grating working by reflection (FIG. 2b). Forty $5 \times 10^9$ $cm^{-2}$ doped wells are used with an absorption curve of the wells centered on 10 $\mu$m and a width of 10 meV. This active zone will be coupled with a plate (one-dimensional) grating whose geometry will be optimized to obtain the maximum peak response. The metallization on the grating constitutes a mirror. This optimization is done in three cases as shown in FIGS. 3a to 3c.

Figures 3A, 3B:
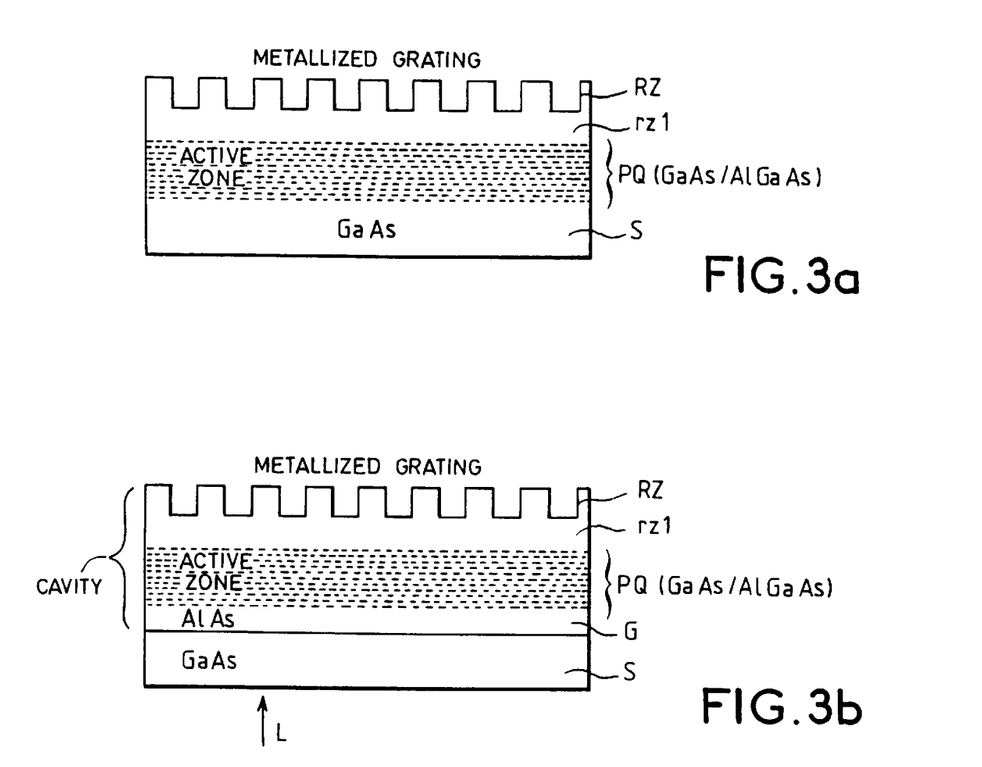
FIGS. 3a to 3c show exemplary devices working in reflection.

FIG. 3a shows the structure of the PQ quantum well with which a diffraction grating RZ is associated, the entire unit being made on a substrate.

FIG. 3b shows a device in which the stack of quantum wells PQ is made on a thick guiding layer G (3.5 $\mu$m) with an optical index smaller than that of the materials of the stack PQ. For example, the layer G is made of AlAs, the stack PQ is made of GaAs/AlGaAs and the substrate is made of GaAs. Thus, the light L reaching the device through the substrate goes through the substrate S, the layer G and then the stack PQ where it is partially absorbed. The light that is not absorbed reaches the grating RZ which diffracts it towards the stack PQ which absorbs a part thereof. The light that is still not absorbed at this stage is reflected towards the grating by the interface between the stack PQ and the layer G.

Figure 3C:
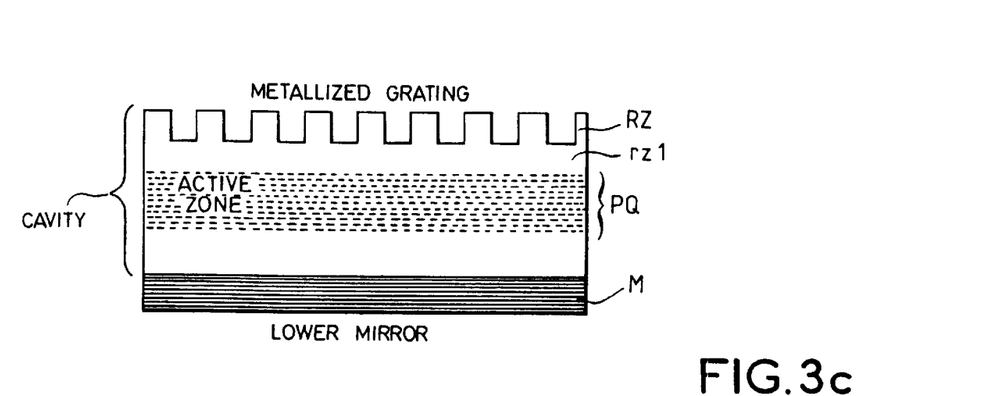

FIG. 3c shows a device with a Bragg mirror M such as the device of FIG. 2b.

In the latter two cases, there is a cavity between two mirrors, the metal on the one hand and the GaAs/AlAs Bragg mirror on the other hand. The thickness of the cavity is chosen so that the cavity resonates at 10 $\mu$m.

Figure 4A:
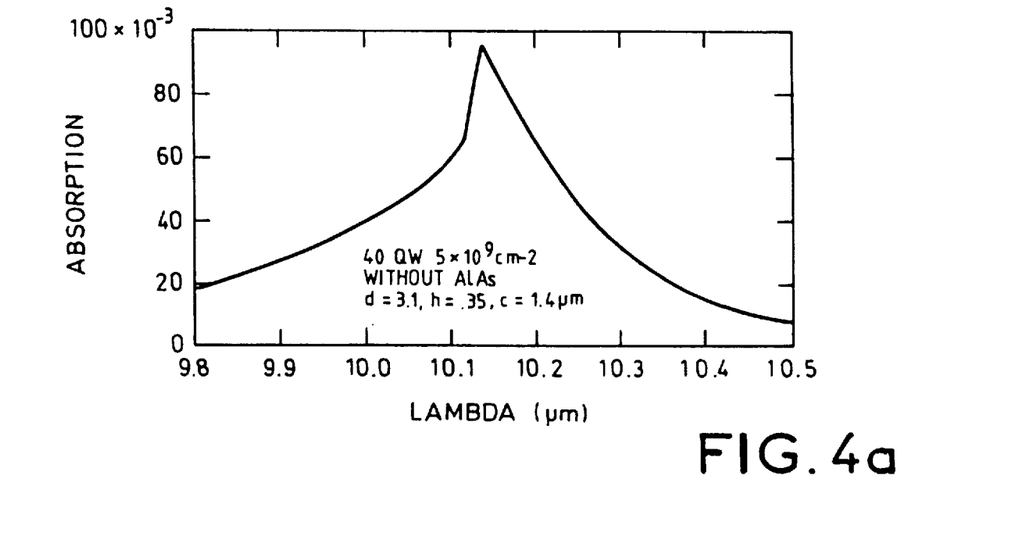
FIGS. 4a and 4b show characteristic curves of operation in detector mode of the devices of FIGS. 3a to 3c.

FIG. 4a shows the absorption without AlAs. The spectrum is wide and the peak absorption is low (9.5%).

Figure 4B:
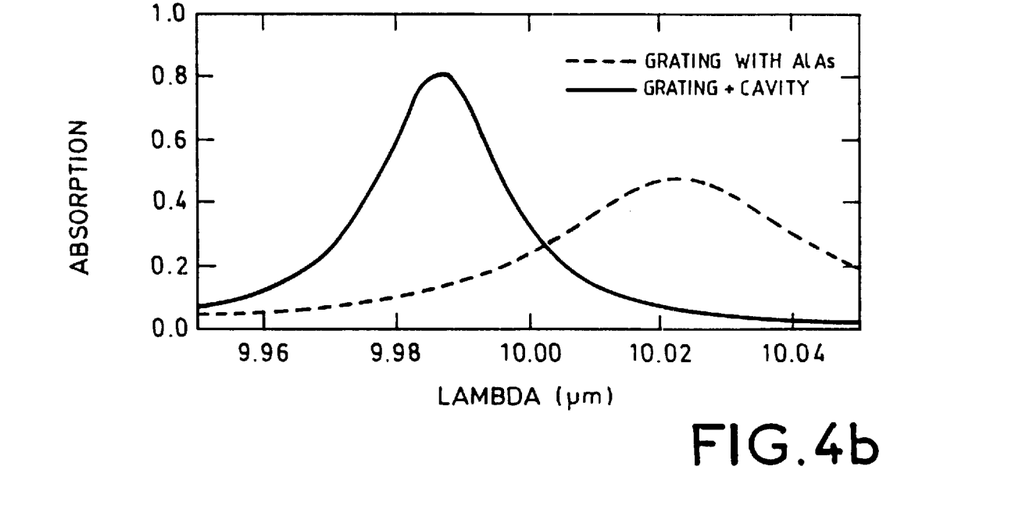

FIG. 4b shows the absorption in the cases of the devices of FIGS. 3b, 3c. The changes of scale on the X axis and the Y axis between FIGS. 4a and 4b may be noted. The spectra are narrow and the peak absorption is high (48% with thick AlAs and 81% with the Bragg mirror). The cavity performs better with the Bragg mirror which has a higher reflection coefficient than the simple AlAs layer: the spectrum is narrow and the absorption is greater.

Figure 5:
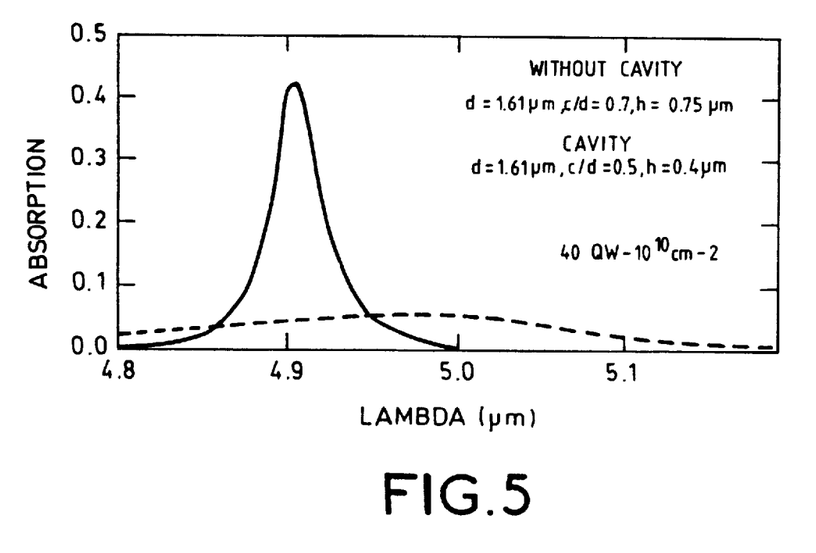

2) An illustration shall now be given of the cavity effect on detectors coupled by dielectrical gratings (non-metallized etched GaAs) used in transmission. There is a layer of forty $10^{11}$ $cm^{-2}$ doped quantum wells having a transition at 5 $\mu$m with a width of 10 mev. FIG. 5 compares the absorption of the layer in two cases:

i) The grating is etched in GaAs and no other structure is added. There is therefore no cavity-forming mirror. The absorption spectrum is wide and the peak absorption is low (5.6%).

ii) The previous structure is covered with three layers $CaF_2$/ZnSe/$CaF_2$ constituting the upper mirror M2 and beneath the active zone, five periods of AlAs/GaAs are positioned constituting the lower mirror M1. This corresponds to the device of FIG. 2a. There is therefore a cavity. The absorption spectrum is narrow and the peak absorption is high (43%): This illustrates the microcavity effect on the absorption of the detector and reveals the effectiveness of the invention.

The device of the invention may also work in modulator mode.

In the case of a modulator comprising a metallized grating as in FIG. 2b, the modulator works in reflection mode.

Figure 6A:
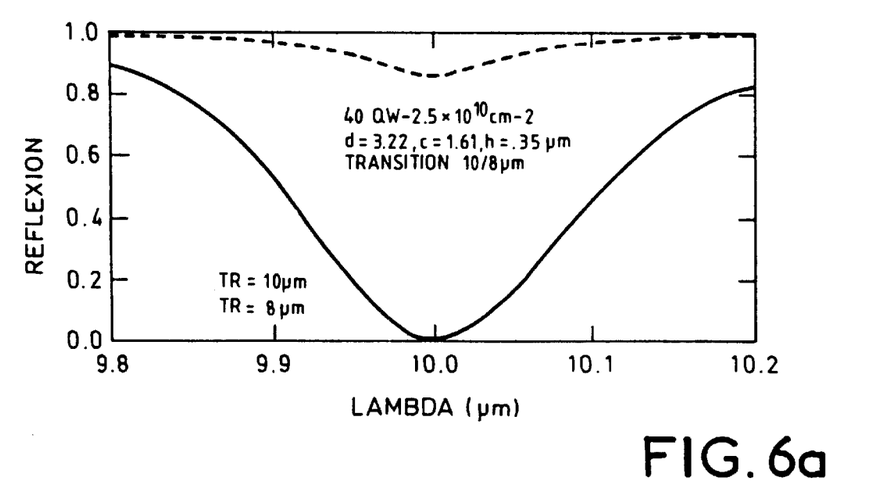
FIGS. 6a and 6b show characteristics of operation of a modulator according to the invention working in reflection mode.
Figure 6B:
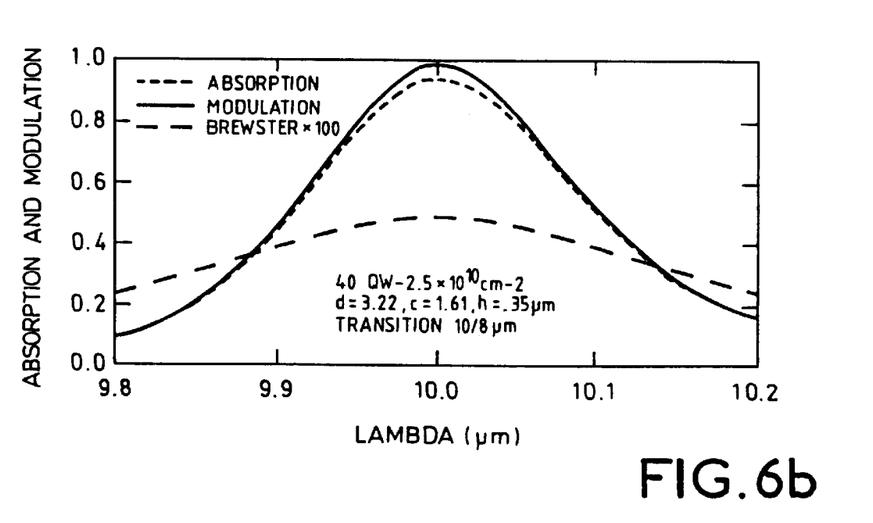

An absorption level of 95.6% (FIG. 6a) and a modulation depth of 99.4% (FIG. 6b) are achieved. It is noted that the spectral widths of modulation are lower with a cavity than without a cavity.

When the modulator is of the type of the device of FIG. 2a, it works in transmission.

Figure 7A:
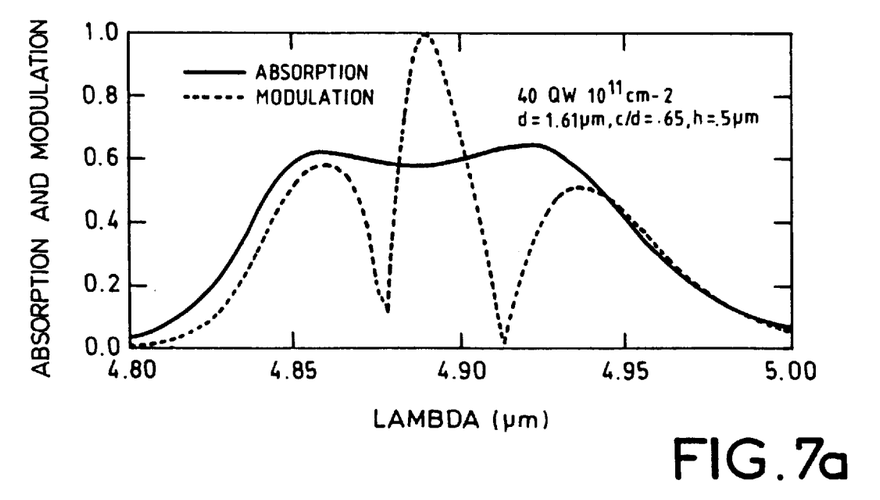
FIGS. 7a and 7b show characteristics of operation of a modulator according to the invention working in transmission mode.
Figure 7B:
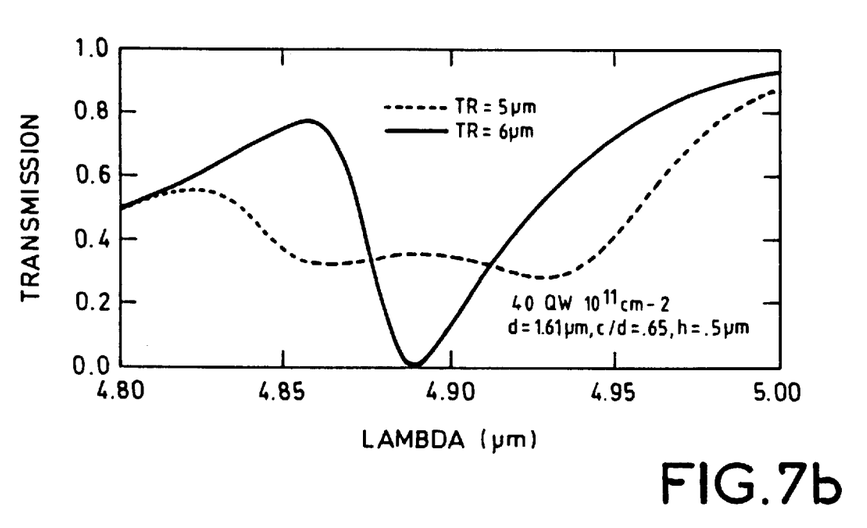

FIGS. 7a and 7b show the performance characteristics of a modulator of this kind with low doping ($10^{11}$ $cm^2$) and a microcavity formed by a lower Bragg mirror M1 (five GaAs/AlAs periods) and a upper Bragg mirror M2 deposited on the grating ($CaF_2$/ZnSe/$CaF_2$). When the absorption wavelength of the well goes from 5 to 6 $\mu$m under the effect of the electrical field, the absorption coefficient of the active zone as well as the index are modified to a major extent. It follows therefrom that the modulation of the transmission of the microcavity depends on the wavelength. It can even change its sign depending on the wavelength. The modulations are very great, especially in the central part of the spectrum (>99%). Transmissions in the ON state are modest (30%) if the high modulation of the central peak is used and are high (80%) if the lowest modulation of the side peaks is used. It must be noted that by varying the grating and cavity parameters, it is possible to greatly modify the modulations and the transmissions in the ON state.

Figure 8:
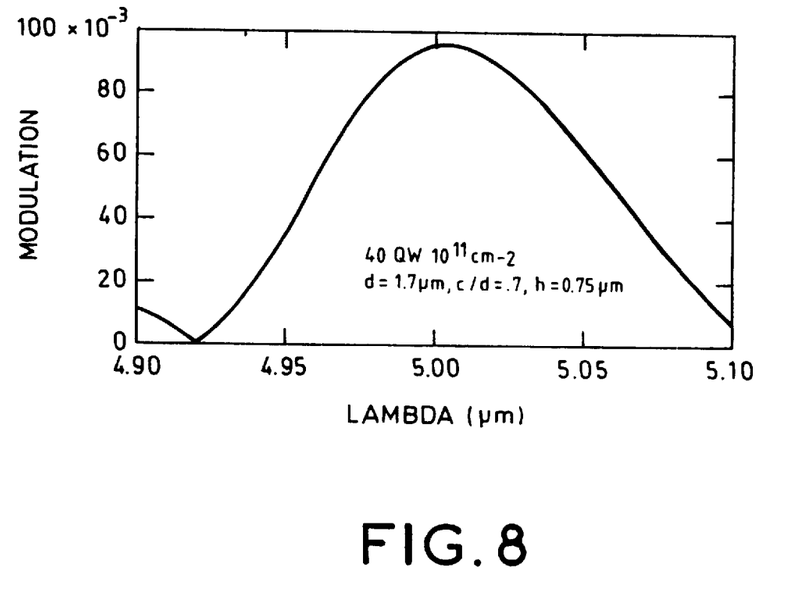
FIG. 8 shows a response curve of a modulator that has no cavity.

It must be noted that a modulator working in transmission with a dielectric grating and low doping ($10^{11}$ $cm^{-2}$) but not included in a cavity gives only a modulation limited to 10% and gives a response curve as shown in FIG. 8.

It can therefore be seen that the invention can be used to obtain significant results. In the foregoing examples, microcavities with mirrors having a low reflection coefficient have been taken. In particular, in the case of dielectrical gratings, it would be worthwhile to take mirrors with higher reflective power (with more periods, layers with greater differences in index like GaAs/aluminum oxide). The field of investigation of the possible structures is therefore very great and the gains in performance characteristics may be even greater than those described here.

A device of this kind can be made in matrix form. Different elementary optoelectronic devices are then made on one and the same substrate.

What is claimed is:

1. An optoelectronic quantum well device comprising:
   a stack of semiconducting layers that have different bandgap energies and constitute quantum wells possessing, in the conduction band, at least two permitted energy levels capable of sustaining an inter-subband transition of a carrier transiting from one of said energy levels to the other, thereby to provide absorption or emission of photons within a selected frequency band corresponding to the difference in said energy levels with relatively little absorption or emission outside said selected frequency band, a diffraction grating adjacent to said stack of layers, to diffract incident light so as to provide an electric field component of said incident light perpendicular to said stack of layers thereby to induce said inter-subband transition in dependence on said perpendicular electric field component, and opposed reflectors sandwiching said diffraction grating and said stack of layers to form an optical cavity, thereby to enhance said absorption or emission of photons within said frequency band.

2. A device according to claim 1, wherein said diffraction grating is formed by two layers demarcated by a surface having relief features, one of said diffraction grating layers placed against said stack of quantum well layers having an index different from that of other said diffraction grating layer placed against one of said reflectors.

3. An optoelectronic quantum well device comprising:

a stack of semiconducting layers that have different bandgap energies and constitute quantum wells possessing, in the conduction band, at least two permitted energy levels capable of sustaining an inter-subband transition of a carrier transiting from one of said energy levels to the other, thereby to provide absorption or emission of photons within a selected frequency band corresponding to the difference in said energy levels with relatively little absorption or emission outside said selected frequency band, and opposed reflectors sandwiching said stack of layers to form an optical cavity, thereby to enhance said absorption or emission of photons within said frequency band, wherein one of said reflectors has a plane shape, while other said reflector has relief features constituting a diffraction grating, said diffraction grating adjacent to said stack of layers, to diffract incident light so as to provide an electric field component of said incident light perpendicular to said stack of layers thereby to induce said inter-subband transition in dependence on said perpendicular electric field component.

4. A device according to one of the claims 2 or 3, wherein the relief features of the grating are linear in shape.

5. A device according to one of the claims 2 or 3, wherein the grating is two-dimensional.

6. A device according to one of the claims 2 or 3, wherein at least one of said reflectors is a Bragg mirror.

7. A device according to one of the claims 2 or 3, wherein said inter-subband transitions take place in quantum wells made up of GaAs/AlGaAs layers.

* * * * *

UNITED STATES PATENT AND TRADEMARK OFFICE
CERTIFICATE OF CORRECTION

PATENT NO.  : 5,818,066
DATED       : October 6, 1998
INVENTOR(S) : Jean-Yves DUBOZ It is certified that error appears in the above-identified patent and that said Letters Patent is hereby corrected as shown below:

On the title page, Item [54], and Column 1, lines 1-3, the title is incorrect. It should read :

--OPTOELECTRONIC QUANTUM WELL DEVICE HAVING AN OPTICAL RESONANT CAVITY AND SUSTAINING INTER-SUBBAND TRANSITIONS--

Signed and Sealed this

Eleventh Day of May, 1999

Attest:

Attesting Officer

Q. TODD DICKINSON

Acting Commissioner of Patents and Trademarks